(12) United States Patent
Shimizu

(10) Patent No.: US 10,916,294 B2
(45) Date of Patent: *Feb. 9, 2021

(54) APPARATUSES AND METHODS FOR CONCENTRATED ARRANGEMENT OF AMPLIFIERS

(71) Applicant: MICRON TECHNOLOGY, INC., Boise, ID (US)

(72) Inventor: Yoshiaki Shimizu, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/551,612

(22) Filed: Aug. 26, 2019

(65) Prior Publication Data
US 2019/0378559 A1    Dec. 12, 2019

Related U.S. Application Data

(63) Continuation of application No. 15/835,257, filed on Dec. 7, 2017, now Pat. No. 10,424,368.

(51) Int. Cl.
*G11C 11/4091* (2006.01)
*H03F 3/45* (2006.01)
(Continued)

(52) U.S. Cl.
CPC .......... *G11C 11/4091* (2013.01); *G05F 3/26* (2013.01); *G11C 5/147* (2013.01); *G11C 7/065* (2013.01); *G11C 7/14* (2013.01); *G11C 11/4074* (2013.01); *G11C 11/4099* (2013.01); *H01L 27/0207* (2013.01); *H01L 27/10829* (2013.01); *H03F 3/14* (2013.01); *H03F 3/45174* (2013.01); *G11C 2211/4013* (2013.01); *H01L 27/088* (2013.01)

(58) Field of Classification Search
CPC ... G11C 11/4091; G11C 11/4099; G11C 7/14; G11C 7/065; G11C 2211/4013; H03F 3/14; H03F 3/45174; G05F 3/26; H01L 27/10829

See application file for complete search history.

(56) References Cited

U.S. PATENT DOCUMENTS 9,620,175 B2    4/2017  Takahashi
9,843,298 B2 *  12/2017 Nam ...................... H03F 3/211
(Continued)

*Primary Examiner* — David Lam
(74) *Attorney, Agent, or Firm* — Dorsey & Whitney LLP

(57) ABSTRACT

Apparatuses and methods for concentrated arrangement of amplifiers. An example apparatus may include a first amplifier circuit including a first and second transistors. The first width different from the second width, the first length different from the second length. The apparatus further including a second amplifier circuit including a third and fourth transistors. The first transistor including a first gate electrode and the third transistor having a third gate electrode each having a first length and a first diffusion region and a third diffusion region, respectively, each having a first width, and the second transistor including a second gate electrode and the fourth transistor having a fourth gate electrode each with a fourth length and a second diffusion region and a fourth diffusion region, respectively, each having a second width. The first and third transistors are collectively arranged and the second and fourth transistors are collectively arranged.

20 Claims, 12 Drawing Sheets

(51) Int. Cl.

| | |
|---|---|
| *H01L 27/108* | (2006.01) |
| *G11C 7/06* | (2006.01) |
| *G05F 3/26* | (2006.01) |
| *G11C 7/14* | (2006.01) |
| *G11C 11/4099* | (2006.01) |
| *H03F 3/14* | (2006.01) |
| *H01L 27/02* | (2006.01) |
| *G11C 11/4074* | (2006.01) |
| *G11C 5/14* | (2006.01) |
| *H01L 27/088* | (2006.01) |

(56) References Cited

U.S. PATENT DOCUMENTS

| | | | |
|---|---|---|---|
| 10,424,368 B2* | 9/2019 | Shimizu | G11C 7/14 |
| 2013/0056832 A1* | 3/2013 | Sato | H01L 21/82384 |
| | | | 257/369 |
| 2013/0334609 A1* | 12/2013 | Deguchi | H01L 27/088 |
| | | | 257/368 |
| 2016/0078920 A1* | 3/2016 | Takahashi | G11C 7/065 |
| | | | 365/203 |
| 2019/0180810 A1 | 6/2019 | Shimizu | |

* cited by examiner

APPARATUSES AND METHODS FOR CONCENTRATED ARRANGEMENT OF AMPLIFIERS

CROSS-REFERENCE TO RELATED APPLICATION(S)

This application is a continuation of U.S. patent application Ser. No. 15/835,257, filed Dec. 7, 2017 and issued as U.S. Pat. No. 10,424,368 on Sep. 24, 2019. This application and patent are incorporated by reference herein, in their entirety, and for any purposes.

BACKGROUND

Current and future generation DRAM and SDRAM applications focus on continued miniaturization of circuit components and low voltage operation. With miniaturization, processes deviations for components intended to have similar physical and/or electrical characteristics may be magnified, causing performance issues of circuitry, and ultimately the memory. One area where process deviations can have an effect on performance is reference voltage generators used to generate reference voltages for detecting signal values.

DETAILED DESCRIPTION

Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments.

Figure 1:
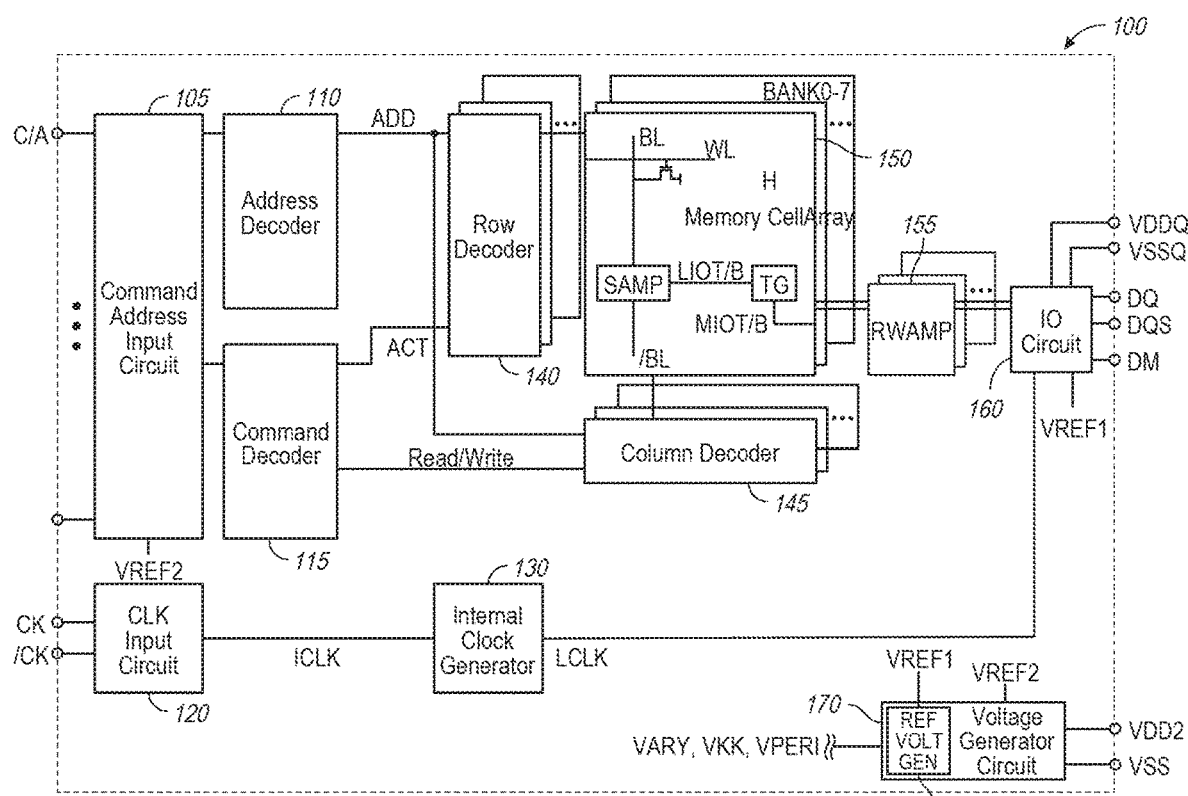
FIG. 1 illustrates a schematic block diagram of a semiconductor device according to an embodiment of the present disclosure.

FIG. 1 illustrates a schematic block diagram of a semiconductor device 100 in accordance with an embodiment of the present disclosure. The semiconductor device 100 includes a memory die. The memory die may include a command/address input circuit 105, an address decoder 110, a command decoder 115, a clock input circuit 120, internal clock generator 130, row decoder 140, column decoder 145, memory arrays 150, read/write amplifiers 155, 110 circuit 160, and power circuit 170.

In some embodiments, the semiconductor device 100 may include, without limitation, a dynamic random-access memory (DRAM) device, such as double data rate (DDR) DDR4, DDR5, low power (LP) DDR, integrated into a single semiconductor chip, for example. The die may be mounted on an external substrate, for example, a memory module substrate, a mother board or the like. The semiconductor device 100 may further include a memory array 150. The memory array 150 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder 140 and the selection of the bit line BL is performed by a column decoder 145. Sense amplifiers (SA) are located for their corresponding bit lines BL and connected to at least one respective local I/O line, which is in turn coupled to a respective one of at least two main I/O line pairs, via transfer gates (TG), which function as switches.

The semiconductor device 100 may employ a plurality of external terminals that include address and command terminals coupled to command/address bus (C/A), clock terminals CK and /CK, data terminals DQ, DQS, and DM, power supply terminals VDD, VSS, VDDQ, and VSSQ, and the ZQ calibration terminal (ZQ).

The command/address terminals may be supplied with an address signal and a bank address signal from outside. The address signal and the bank address signal supplied to the address terminals are transferred, via the command/address input circuit 105, to an address decoder 110. The address decoder 110 receives the address signal and supplies a decoded row address signal to the row decoder 140, and a decoded column address signal to the column decoder 145. The address decoder 110 also receives the bank address signal and supplies the bank address signal to the row decoder 140, the column decoder 145.

The command/address terminals may further be supplied with a command signal from outside, such as, for example, a memory controller. The command signal may be provided, via the C/A bus, to the command decoder 115 via the command/address input circuit 105. The command decoder 115 decodes the command signal to generate various internal commands that include a row command signal to select a word line and a column command signal, such as a read command or a write command, and to select a bit line.

Accordingly, when a read command is issued and a row address and a column address are timely supplied with the read command, read data is read from a memory cell in the memory array 150 designated by these row address and column address. The read data DQ is output to outside from the data terminals DQ (data), DQS (data strobe), and DM (data mask) via read/write amplifiers 155 and an input/ output circuit 160. Similarly, when the write command is issued and a row address and a column address are timely supplied with this command, and then write data is supplied to the data terminals DQ, DQS, DM, the write data is received by data receivers in the input/output circuit 160, and supplied via the input/output circuit 160 and the read/write amplifiers 155 to the memory array 150 and written in the memory cell designated by the row address and the column address.

Turning to the explanation of the external terminals included in the semiconductor device 100, the clock terminals CK and /CK are supplied with an external clock signal and a complementary external clock signal, respectively. The external clock signals (including complementary external clock signal) may be supplied to a clock input circuit 120. The clock input circuit 120 may receive the external clock signals to generate an internal clock signal ICLK. The internal clock signal ICLK is supplied to an internal clock generator 130 and thus a phase controlled internal clock signal LCLK is generated based on the received internal clock signal ICLK. Although not limited thereto, a delay-locked loop (DLL) circuit, a duty cycle correction (DCC) circuit, or a combination thereof may be used as the internal clock generator 130. The phase controlled internal clock signal LCLK is supplied to the input/output circuit 160 and is used as a timing signal for determining an output timing of read data. In some examples, the clock generator 130 includes a duty cycle correction (DCC) circuit configured to correct a duty cycle of the LCLK signal. The DCC may include circuitry to create multiple divided clocks with shifted phases, and to generate integrated clocks from the multiple divided clocks. The integrated clocks maybe used to determine a duty cycle error, which may be used to apply a correction to the LCLK signal.

The power supply terminals are supplied with power supply potentials VDD2 and VSS. These power supply potentials VDD2 and VSS are supplied to an internal voltage generator circuit 170. The internal voltage generator circuit 170 generates various internal potentials VARY, VKK, VPERI, and the like based on the power supply potentials VDD2 and VSS. The internal potential VARY are mainly used in the sense amplifiers included in the memory array 150, the internal potential VKK is mainly used in the row decoder 140, and the internal potential VPERI is used in many other circuit blocks. The internal voltage generator circuit 170 may further include a reference voltage generator circuit 171 configured to provide first and second reference voltages VREF1 and VREF2. The VREF1 voltage may be used by the I/O circuit 160 to detect signal levels on the DQs, and the VREF2 voltage may be used by the command/address input circuit 105 to detect signal levels on the C/A bus. In some examples, the reference voltage generator circuit 171 may include a bias signal generation circuit and voltage amplifier circuits. Rather than grouping transistors based on the bias signal generation circuit and the voltage amplifier circuits, the reference voltage generator circuit 171 may group transistor by physical characteristics. Grouping transistors of the reference voltage generator circuit 171 by physical characteristic type may reduce opportunity for process deviations causing differences in transistors intended to possess similar physical characteristics, as these transistors are fabricated at contemporaneously and proximately, sharing the same doping levels and other characteristics.

The power supply terminals are also supplied with power supply potentials VDDQ and VSSQ. These power supply potentials VDDQ and VSSQ are supplied to the input/output circuit 160. The power supply potentials VDDQ and VSSQ are typically the same potentials as the power supply potentials VDD2 and VSS, respectively. However, the dedicated power supply potentials VDDQ and VSSQ are used for the input/output circuit 160 so that power supply noise generated by the input/output circuit 160 does not propagate to the other circuit blocks.

Figure 2:
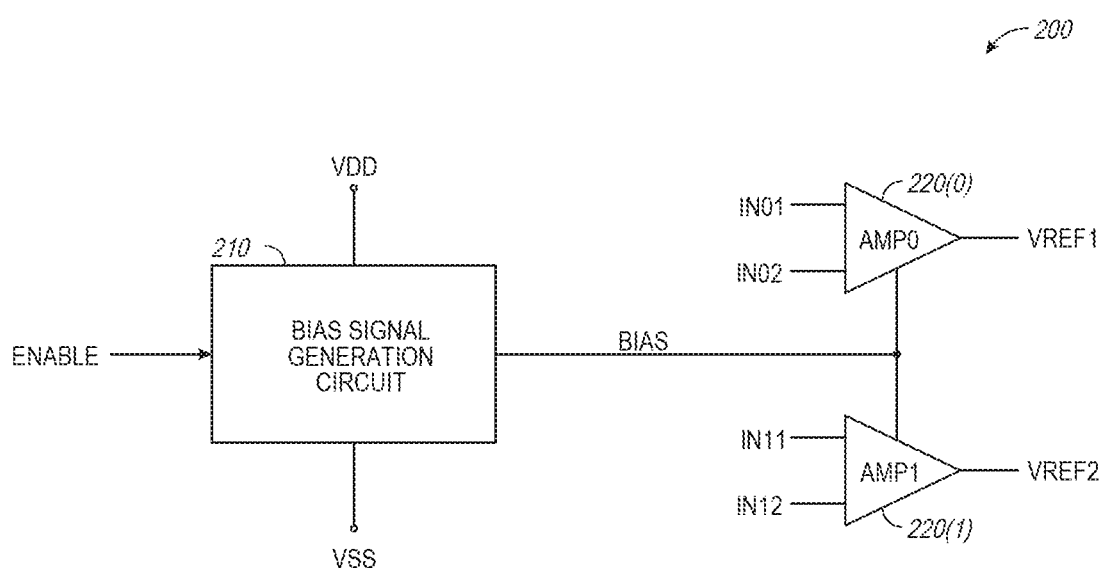
FIG. 2 illustrates a schematic block diagram of a reference voltage generator circuit in accordance with an embodiment of the disclosure.

FIG. 2 illustrates a schematic block diagram of a reference voltage generator circuit 200 in accordance with an embodiment of the disclosure. The reference voltage generator circuit 171 of FIG. 1 may implement the reference voltage generator circuit 200. The reference voltage generator circuit 200 includes a bias signal generation circuit 210 and amplifier circuits 220(0)-(1). Based on the VDD and VSS voltages, the bias signal generation circuit 210 may generate bias signals BIAS in response to the enable signal. The amplifier circuits 220(0)-(1) may receive respective input signals IN01, IN02, IN11, and 1N12, and may provide a respective output signal VREF1 and VREF2. The voltage levels of the VREF1 and VREF2 signals may be based on voltage levels of the bias signals BIAS. Each of the bias signal generation circuit 210 and the amplifier circuits 220(0)-(1) may include multiple groups of transistors that are designed to perform the same or similar functions (e.g., handle specific voltage magnitude differentials) and have the same or similar characteristics (e.g., same gate length and/or same diffusion region width). These groups of transistors may be arranged in such a way that each individual group is collectively configured in a respective collection that is physically proximate to one another such that the individual group may be fabricated at the same time and using the same process. The proximity of the transistors to one another, as well as the contemporaneous fabrication may reduce deviations among the transistors within a group as compared with a physically disparate arrangement of the same transistors. Potential deviations may include differences in doping in an implanted material at a time of finish. Further, co-locating similar transistors in a group may reduce a size, as a number of dummy transistors used to separate different transistor types may be reduced.

Figure 3:
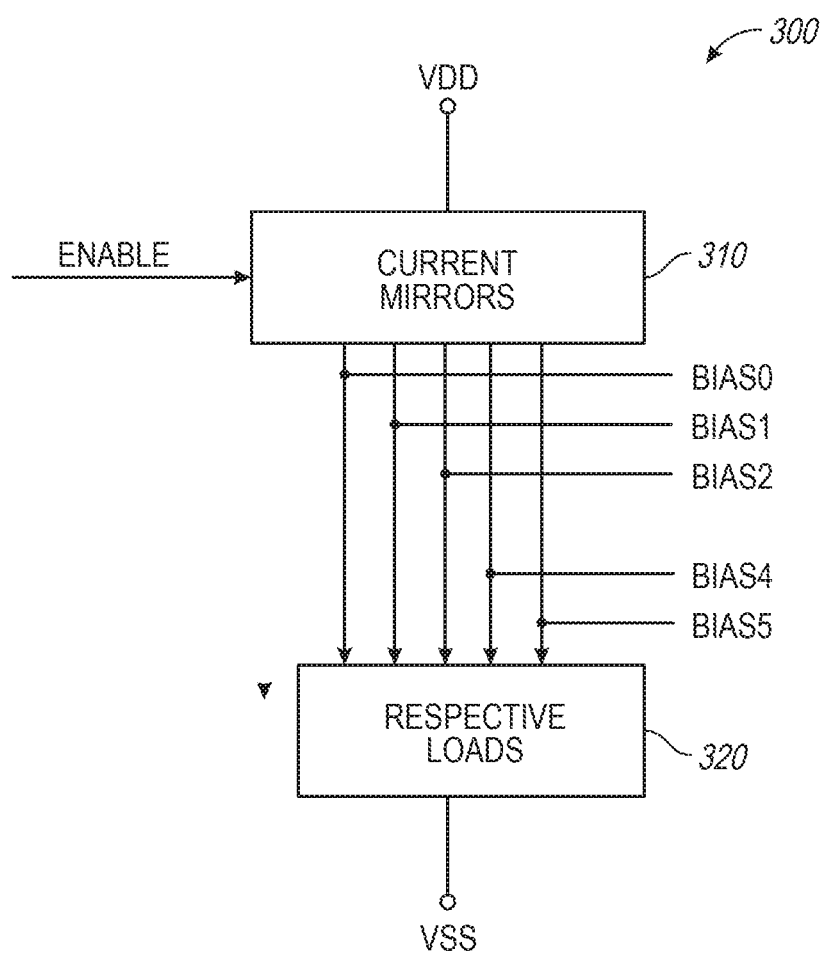
FIG. 3 illustrates a schematic block diagram of a bias signal generation circuit in accordance with an embodiment of the disclosure.

FIG. 3 illustrates a schematic block diagram of a bias signal generation circuit 300 in accordance with an embodiment of the disclosure. The bias signal generation circuit 210 of FIG. 2 may implement the bias signal generation circuit 300. The bias signal generation circuit 300 includes current mirrors 310 and respective loads 320. The bias signal generation circuit is provided power supply potentials VDD and VSS. Together, the current mirrors 310 and the respective loads 320 may generate the bias signals BIAS in response to enable signals ENABLE. In the embodiment of FIG. 3, the bias signals include five different bias signals BIAS0-2 and BIAS4-5. The bias signals BIAS may include greater or fewer bias signals in other embodiments. Each current mirror of the current mirrors 310 may include individual transistors that are designed to perform the same or similar functions (e.g., handle specific voltage magnitude differentials) and have the same or similar characteristics (e.g., same gate length and/or same diffusion region width) as transistors from others of the current mirrors 310. Similarly, each respective load of the respective loads 320 may include individual transistors that designed to exert the same or similar functions (e.g., handle specific voltage magnitude differentials) and have the same or similar characteristics (e.g., same gate length and/or same diffusion region width) as transistors from other loads of the respective loads 320. These similar transistors may be grouped together and each individual group of transistors may be arranged in a collection that is physically proximate to one another (e.g., in the same well/substrate region), such that the individual group may be fabricated at the same time using the same process. The proximity of the transistors to one another, as well as the contemporaneous fabrication may reduce deviations among the transistors within a group as compared with a physically disparate arrangement of the same transistors. Potential deviations may include differences in doping in an implanted material at a time of finish. Further, co-locating similar transistors in a group may reduce a size, as a number of dummy transistors used to separate different transistor types may be reduced.

Figure 4:
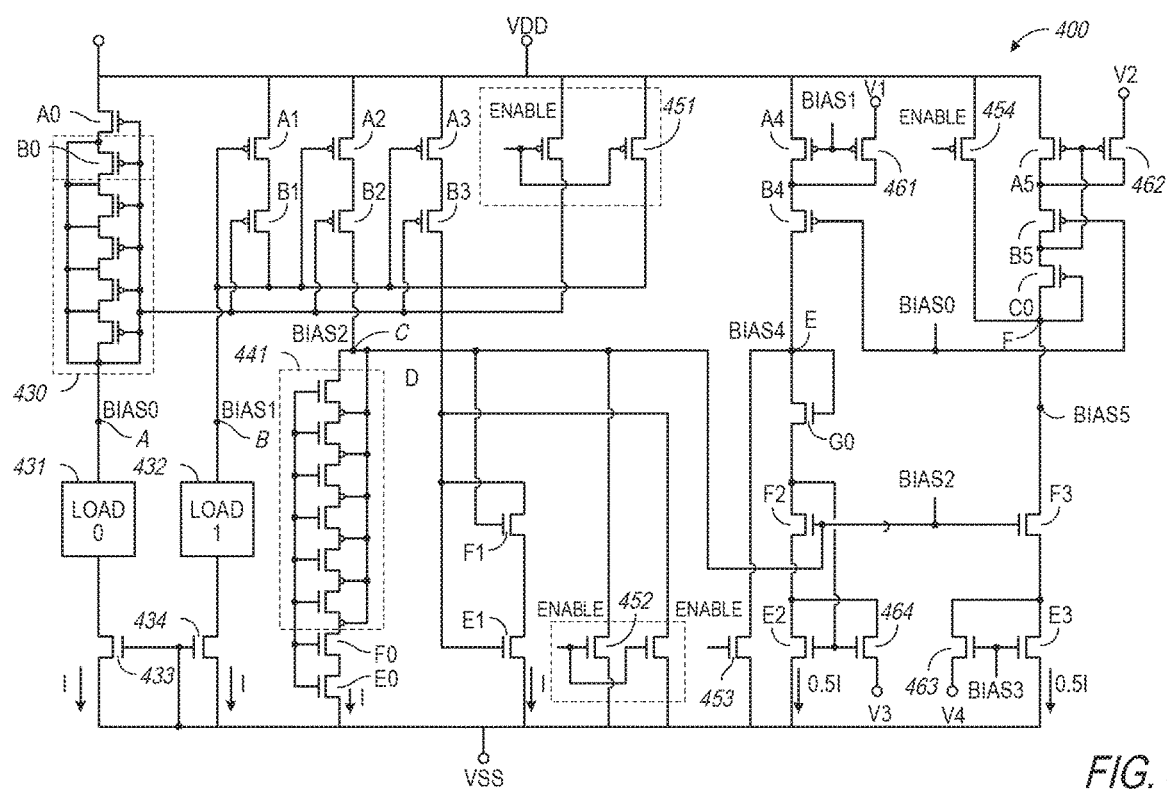
FIG. 4 illustrates a schematic diagram of a bias signal generation circuit in accordance with an embodiment of the disclosure.

FIG. 4 illustrates a schematic diagram of a bias signal generation circuit 400 in accordance with an embodiment of the disclosure. The bias signal generation circuit 210 of FIG. 2 and/or the bias signal generation circuit 300 of FIG. 3 may implement the bias signal generation circuit 400. The bias signal generation circuit 400 includes group A transistors A0-A5, group B transistors B0-B5, group C transistor C0, group E transistors E0-E3, group F transistors F0-F3, group G transistor G0. The group A transistors A0-A5, the group B transistors B0-B5, and the group C transistor C0 may include p-type transistors. The group E transistors E0-E3, the group F transistors F0-F3, and the group G transistor G0 may include n-type transistors. The bias signal generation circuit 400 may additionally include a voltage driver circuit 430 having a series of serially-coupled p-type transistors, a load 0 431, a load 1 432, a voltage driver circuit 441 having a series of serially-coupled n-type transistors, an enable circuit 451 having two parallel coupled p-type transistors, an enable circuit 452 having two parallel coupled n-type transistors, an enable transistor (e.g., n-type) 453, an enable transistor (e.g., p-type) 454, current mirror transistors (e.g., p-type) 461 and 462, and current mirror transistors (e.g., n-type) 463 and 464. In response to an enable signal ENABLE, the circuitry of the bias signal generation circuit 400 may provide bias signals BIAS0-2 and BIAS4-5. The BIAS0-2 and BIAS4-5 signals may drive voltage levels of an amplifier.

In operation, the transistors of the enable circuit 451, the transistors of the enable circuit 452, the enable transistor 453, and the enable transistor 454 may each be activated in response to the ENABLE signal. In some examples, the ENABLE signal may be an active high signal. In response to the enable circuit 451 being activated, the transistors A0 and B0, along with the voltage driver circuit 430, may provide the BIAS0 signal at a node between the load 0 431 and the voltage driver circuit 430. Further in response to the enable circuit 451 being activated, the transistors A1 and B1 may provide the BIAS0 signal at a node A between the load 1 432 and the B1 transistor.

In response to the enable circuit 451 and the enable circuit 452 being activated, the BIAS1 signal may be provided at a node B between the transistors A2 and B2 and the voltage driver circuit 441 and transistors E0 and F0. 430.

In response to the enable transistor 453 and the enable transistor 454 being activated, the BIAS4 signal may be provided at a node E between the transistors A4 and B4 and the transistors G0, E0, and F0. Further in response to the enable transistor 453 and the enable transistor 454 being activated, the BIAS5 signal may be provided at a node F between the transistors A5 and B5 and the transistors E3 and F3. The voltage of the BIAS4 signal may be based on a voltage V1 provided to the transistor 461 and a voltage V3 provided to the transistor 464. The voltage of the BIAS5 signal may be based on a voltage V2 provided to the transistor 462 and a voltage V4 provided to the transistor 463. In some examples, the current flowing through the nodes for the BIAS0-3 signals may be twice the current flowing through the nodes for the BIAS4 and BIAS5 signals.

Figure 5:
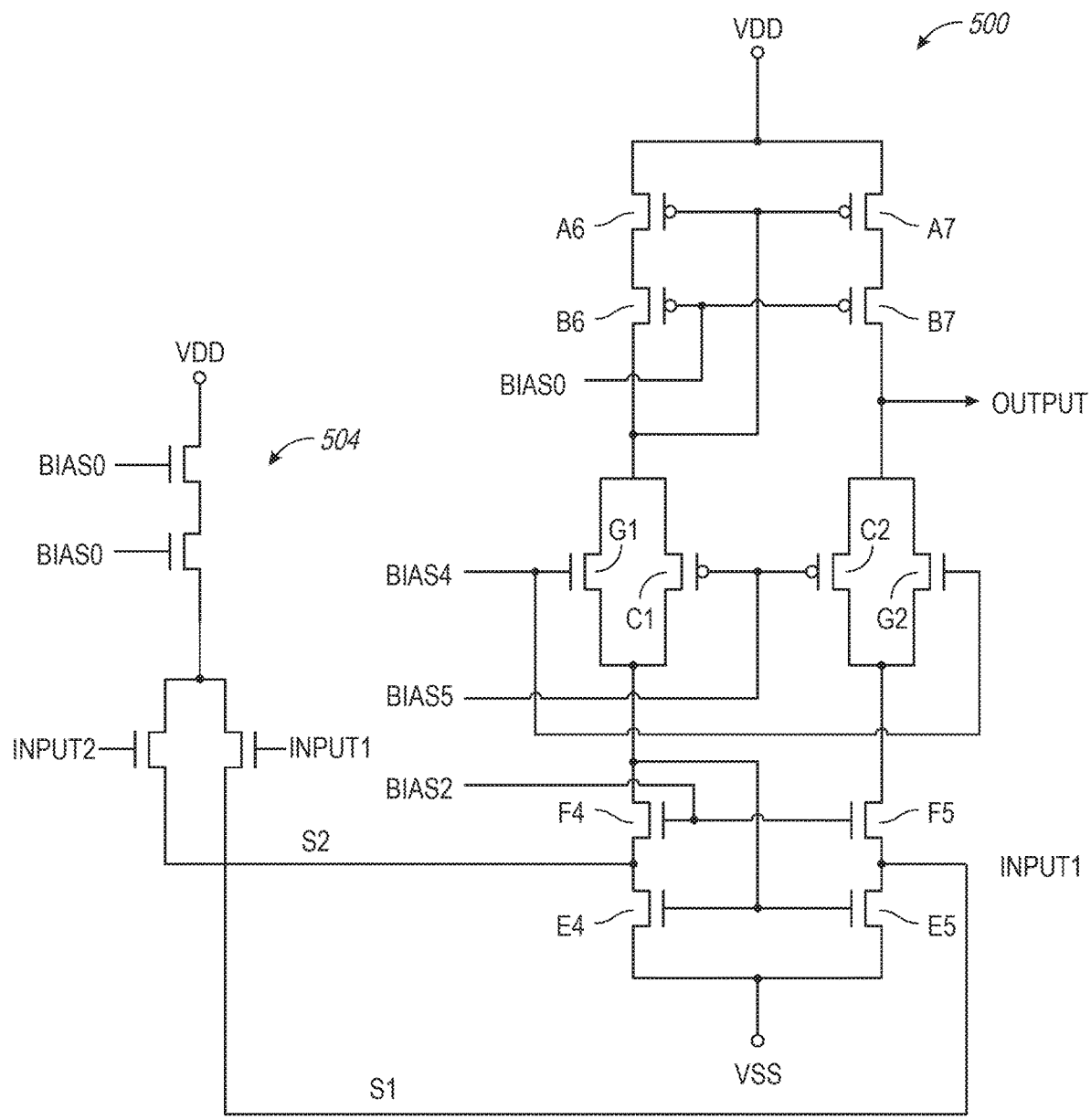
FIG. 5 illustrates a schematic diagram of an amplifier circuit in accordance with an embodiment of the disclosure.

FIG. 5 illustrates a schematic diagram of an amplifier circuit 500 in accordance with an embodiment of the disclosure. The amplifier circuits 220(0) and/or 220(1) of FIG. 2 may implement the amplifier circuit 500. The amplifier circuit 500 an input circuit with four transistors and configured to receive first and second input signals INPUT1 and INPUT2, in addition to bias signals BIAS0 and BIAS2 to provide driver signals S1 and S2. The amplifier circuit further includes group A transistors A6-A7, group B transistors B6-B7, group C transistors C1-C2, group E transistors E4-E5, group F transistors F4-F5, group G transistors G1 and G2. The group A transistors A6-A7, the group B transistors B6-B7, and the group C transistors C1-C2 may include p-type transistors. The group E transistors E4-E5, the group F transistors F4-F5, and the group G transistors G1-G2 may include n-type transistors. In response to values of the INPUT1 and INPUT2 signals (e.g., via the S1 and S2 signals), the amplifier circuit 500 provides an output signal OUTPUT.

In operation, the input circuit 504 receives INPUT1 and INPUT2 signals and the BIAS0 and BIAS2 signals, and provides the S1 and S2 signals at an output based on the INPUT1 and INPUT2 signals and the BIAS0 and BIAS2 signals. The transistors A6 and A7 may be coupled to a VDD voltage and the transistors E4 and E5 may be coupled to a VSS voltage. The gates of transistors A6 and A7 may be controlled by a node between transistor B1 and transistors G1 and C1. The gates of transistors B6 and B7 may be controlled by a BIAS0 signal. The transistor G1 may be coupled in parallel with transistor C1, and the transistor G2 may be coupled in parallel with transistor C2. The gates of the transistors C1 and C2 may be controlled by the BIAS4 signal. The gates of the transistors G1 and G2 may be controlled by the BIAS5 signal. The gates of transistors F4 and F5 may be controlled by a BIAS2 signal. The gates of transistors E4 and E5 may be controlled by a node between transistor F4 and transistors G1 and C1. The S1 signal from the input circuit 504 may be received at a node between the transistor F5 and the transistor E5. The S2 signal from the input circuit 504 may be received at a node between the transistor F4 and the transistor E4. The OUTPUT signal may be provided at a node between the transistor B2 and transistors G2 and C2 having a logical value (e.g., logical high or logical low), with the logical high voltage and the logical low voltage each based on the BIAS0, BIAS2, BIAS4, and BIAS5 signals.

The BIAS0, BIAS2, BIAS4, and BIAS5 signals may be provided by the bias signal generation circuit 400 of FIG. 4. Together, FIGS. 4 and 5 depict individual circuits (e.g., the bias signal generation circuit 400 and the amplifier circuit 500) that each include transistors having similar characteristics and performing similar functions. These transistors are separated into respective groups (e.g., transistor group A0-A7, transistor group B0-B7, transistors C0-C2, transistor group E0-E5, transistor group F0-F5, and transistors G0-G2, respectively). In some examples transistors within each respective group of transistors may perform the same or similar functions (e.g., handle specific voltage magnitude differentials) and have the same or similar characteristics (e.g., same gate length and/or same diffusion region width) as transistors from other respective groups. Each individual group of transistors may be arranged in a collection that is physically proximate to one another, such that the individual group may be fabricated at the same time using the same process. The proximity of the transistors to one another, as well as the contemporaneous fabrication may reduce deviations among the transistors within a group as compared with a physically disparate arrangement of the same transistors. Potential deviations may include differences in doping in an implanted material at a time of finish. Further, co-locating similar transistors in a group may reduce a size, as a number of dummy transistors used to separate different transistor types may be reduced.

Figure 6:
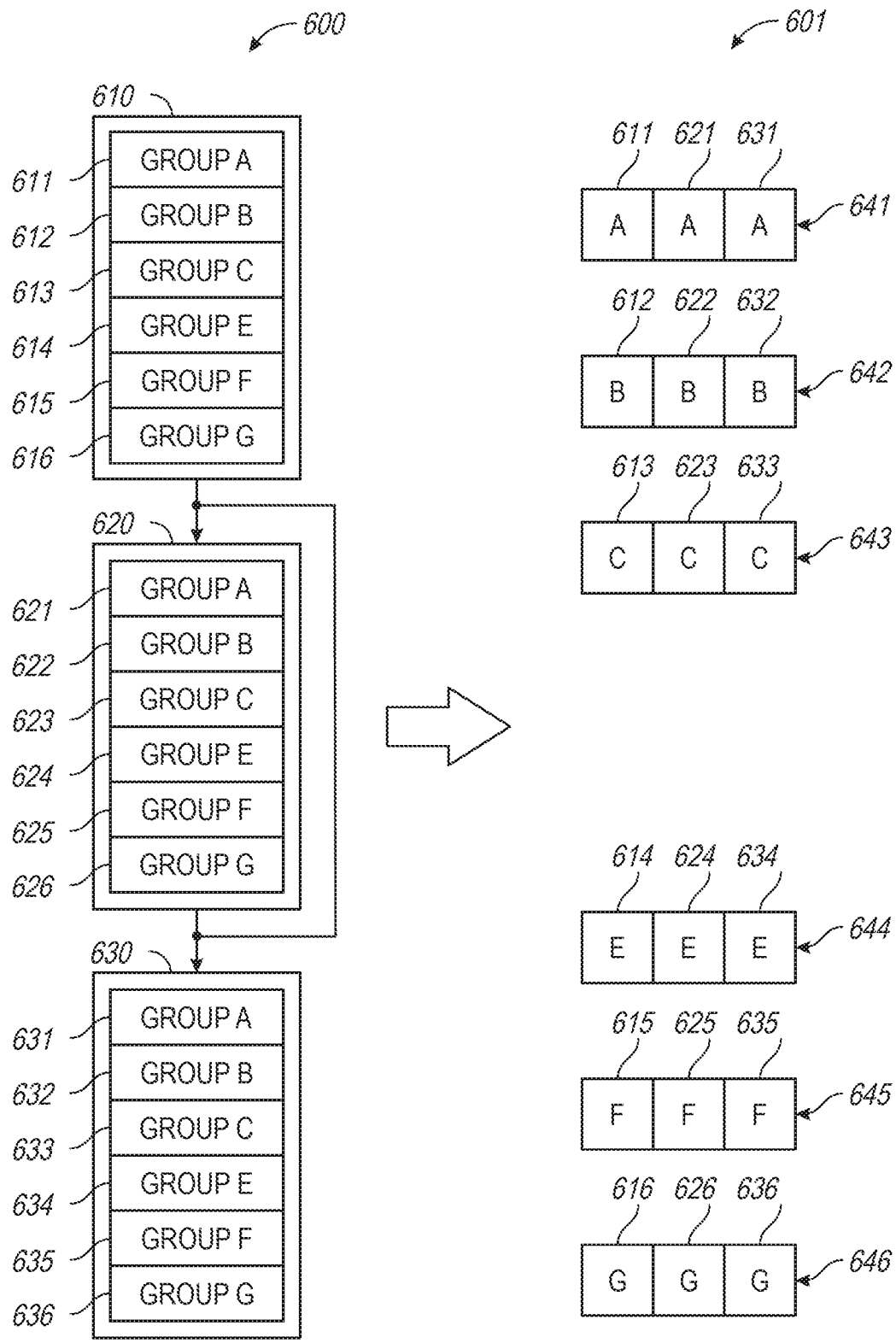
FIG. 6 illustrates block diagrams of an ungrouped reference voltage generator circuit and a grouped reference voltage generator circuit in accordance with an embodiment of the disclosure.

FIG. 6 illustrates block diagrams of an ungrouped reference voltage generator circuit 600 and a grouped reference voltage generator circuit 601 in accordance with an embodiment of the disclosure. The ungrouped reference voltage generator circuit 600 may include a bias signal generation circuit 610, an amplifier circuit 620, and an amplifier circuit 630. The bias signal generation circuit 610 may implement the bias signal generation circuit 210 of FIG. 2, the bias signal generation circuit 300 of FIG. 3, and/or the bias signal generation circuit 400 of FIG. 4. The amplifier circuit 620 may implement the amplifier circuit 220(0) of FIG. 2 and/or the amplifier circuit 500 of FIG. 5. The amplifier circuit 630 may implement the amplifier circuit 220(1) of FIG. 2 and/or the amplifier circuit 500 of FIG. 5.

The bias signal generation circuit 610 may include subgroup A transistors 611, subgroup B transistors 612, subgroup C transistors 613, subgroup E transistors 614, subgroup F transistors 615, and subgroup G transistors 616. The amplifier circuit 620 may include subgroup A transistors 621, subgroup B transistors 622, subgroup C transistors 623, subgroup E transistors 624, subgroup F transistors 625, and subgroup G transistors 626. The amplifier circuit 630 may include subgroup A transistors 631, subgroup B transistors 632, subgroup C transistors 633, subgroup E transistors 634, subgroup F transistors 635, and subgroup G transistors 636. In the ungrouped reference voltage generator circuit 600, each of the bias signal generation circuit 610, the amplifier circuit 620, and the amplifier circuit 630 are fabricated in separate locations with circuitry connecting the individual circuits together. Conversely, in the grouped reference voltage generator circuit 601, some of the circuitry of each of the bias signal generation circuit 610, the amplifier circuit 620, and the amplifier circuit 630 are grouped together, and the individual groups are constructed together in a common location. For example, the subgroup A transistors 611, the subgroup A transistors 621, and the subgroup A transistors 631 are grouped together to form the group A transistors 641. The subgroup B transistors 612, the subgroup B transistors 622, and the subgroup B transistors 632 are grouped together to form the group B transistors 642. Similar groupings may be constructed with the remaining transistor groups to form the group C transistors 643, the group E transistors 645, the group F transistors 646, and the group G transistors 647. Transistors within each respective group of transistors may perform the same or similar functions (e.g., handle specific voltage magnitude differentials) and have the same or similar characteristics (e.g., same gate length and/or same diffusion region width), and therefore may be collectively arranged in a collection that is physically proximate to one another (e.g., the same well/substrate region), such that the individual group may be fabricated at the same time using the same process. Each of the respective group A, B, C, E, F, and G transistors 641-646 may be surrounded by a respective element isolation region to electrically isolate the well/substrate region from other well/substrate regions. The proximity of the transistors to one another, as well as the contemporaneous fabrication may reduce deviations among the transistors within a group as compared with a physically disparate arrangement (e.g., as shown in the ungrouped reference voltage generator circuit 600) of the same transistors. Potential deviations may include differences in doping in an implanted material. Further, co-locating similar transistors in a group may reduce a size, as a number of dummy transistors used to separate different transistor types may be reduced. It is appreciated that the order within a transistor group may vary from the order depicted without departing from the scope of the disclosure. For example, in the group A transistors 641, the order may be the subgroup A transistors 621, the subgroup A transistors 611, and the subgroup A transistors 631.

Figure 7:
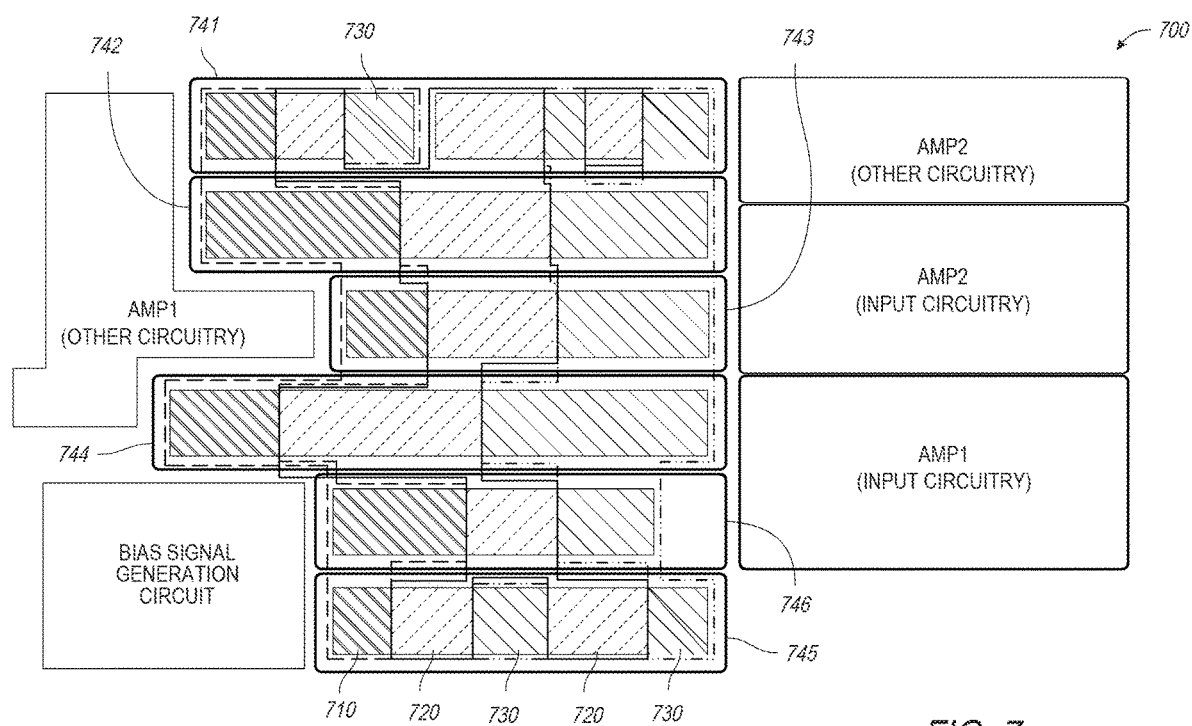
FIG. 7 illustrates a circuit diagram of a grouped reference voltage generator circuit in accordance with an embodiment of the disclosure.

FIG. 7 illustrates a circuit diagram of a grouped reference voltage generator circuit 700 in accordance with an embodiment of the disclosure. The grouped reference voltage generator circuit 700 may include a bias signal generation circuit 710, an amplifier circuit 720, and an amplifier circuit 730. The bias signal generation circuit 710 may implement at least a portion of the bias signal generation circuit 210 of FIG. 2, the bias signal generation circuit 300 of FIG. 3, the bias signal generation circuit 400 of FIG. 4, and/or the grouped reference voltage generator circuit 601 of FIG. 6. The amplifier circuit 720 may implement at least a portion of the amplifier circuit 220(0) of FIG. 2, the amplifier circuit 500 of FIG. 5, and/or the grouped reference voltage generator circuit 601 of FIG. 6. The amplifier circuit 730 may implement at least a portion of the amplifier circuit 220(1) of FIG. 2, the amplifier circuit 500 of FIG. 5, and/or a portion of the amplifier circuit 630 of FIG. 6. As shown in the grouped reference voltage generator circuit 700, each of the group A transistors 741, the group B transistors 742, the group C transistors 743, the group E transistors 744, the group F transistors 745, and the group G transistors 746 may include transistors from each of the bias signal generation circuit 710, the amplifier circuit 720, and the amplifier circuit 730. The transistors of each respective group A, B, C, E, F, and G transistors 741-746 may perform the same or similar functions (e.g., handle specific voltage magnitude differentials) and have the same or similar characteristics (e.g., same gate length and/or same diffusion region width), and therefore may be collectively arranged in a collection that is physically proximate to one another (e.g., in the same well/substrate region), such that the individual group may be fabricated at the same time using the same process. The proximity of the transistors to one another, as well as the contemporaneous fabrication may reduce deviations among the transistors within a group as compared with a physically disparate arrangement (e.g., as shown in the ungrouped reference voltage generator circuit 600) of the same transistors. Potential deviations may include differences in doping in an implanted material at a time of finish. Further, co-locating similar transistors in a group may reduce a size, as a number of dummy transistors used to separate different transistor types may be reduced.

Figure 8:
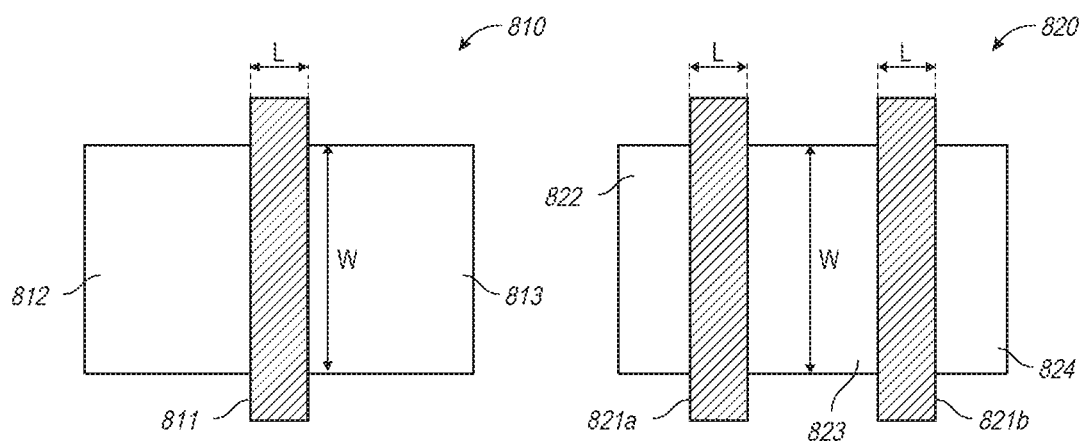
FIG. 8 illustrates a block diagram of a single-gate transistor and a double-gate transistor in accordance with an embodiment of the disclosure.

FIG. 8 illustrates a block diagram of a single-gate transistor 810 and a double-gate transistor 820 in accordance with an embodiment of the disclosure. The single-gate transistor 810 includes a gate 811, a drain 813, and a source 812. The gate length of the gate 811 is a length L and the width of the diffusion region associated with the gate 811 is a width W. The double-gate transistor 820 includes a first gate 821a, a second gate 821b, a shared drain 823, a first source 822, and a second source 824. The gate length of each of the first and second gates 821a and 821b is a length L and the width of the diffusion region associated with each of the first and second gates 821a and 821b is a width W. Because the single-gate transistor 810 and the double-gate transistor 820 share some of the same physical characteristics (e.g., gate lengths and diffusion region widths), the single-gate transistor 810 and the double-gate transistor 820 may represent transistors that may be grouped together. The single-gate transistor 810 may correspond to the transistors A4 and A5 of FIG. 4, in some examples, and the double-gate transistor 820 may correspond to the transistors A0-A3, A6, and A7 of FIGS. 4 and 5, in some examples.

Figure 9A:
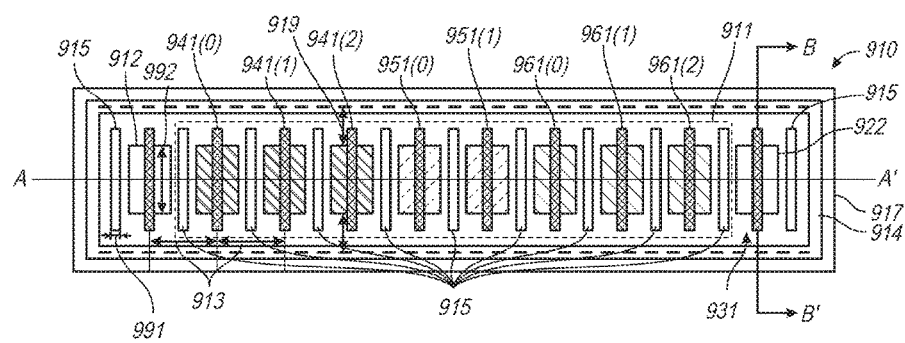
FIGS. 9A-9C illustrates a three views of a divided transistor group in accordance with an embodiment of the disclosure.
Figure 9C:
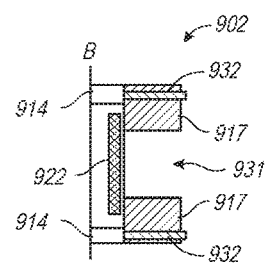
Figure 9B:
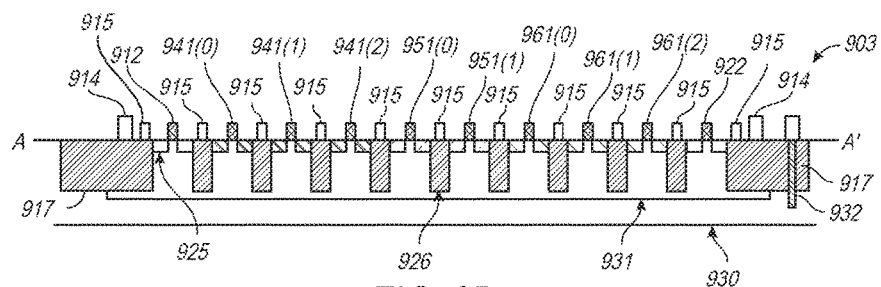

FIGS. 9A-9C illustrates a three views 910, 903, and 902 of a divided transistor group 911 in accordance with an embodiment of the disclosure. FIG. 9A depicts a top-down view 910 of the transistor group 911. FIG. 9B depicts a cross sectional view 903 of the top-down view 910 along the cross section line A-A'. FIG. 9C depicts a cross sectional view 902 of the top-down view 910 along the cross section line B-B'. The divided transistor group 911 is exemplary of one of the groups A, B, C, E, F, and G transistors 641-646 of FIG. 6 or the groups A, B, C, E, F, and G transistors 741-746 of FIG. 7. The divided transistor group 911 may be produced in a single well/substrate region 931 surrounded by an element isolation region 917 to isolate the well/substrate region 931 from other well/substrate regions, in some examples. The group of transistors included in the divided transistor group 911 includes transistors 941(0)-(2), 951(0)-(1), and 961(0)-(2). The divided transistor group 911 also includes dummy transistors 912 and 922 at each end of the divided transistor group 911. The transistors 941(0)-(2), 951(0)-(1), and 961(0)-(2) and dummy transistors 912 and 922 may have the same pitch 913 and the same distance 919 to a well/substrate contact 914 of the well/substrate region 931. Each of the transistors 941(0)-(2), 951(0)-(1), and 961(0)-(2) and dummy transistors 912 and 922 may have a same gate length 991 and a same diffusion region width 992. Individual dummy transistors 915 with a deep well 926 may be inserted between each of the transistors 941(0)-(2), 951(0)-(1), and 961(0)-(2) such that the respective diffusion regions 925 do not overlap with each other. The well/substrate region 931 may be formed in a substrate 930. A substrate contact 932 may be formed to connect the substrate 930 to a reference voltage.

Figure 10:
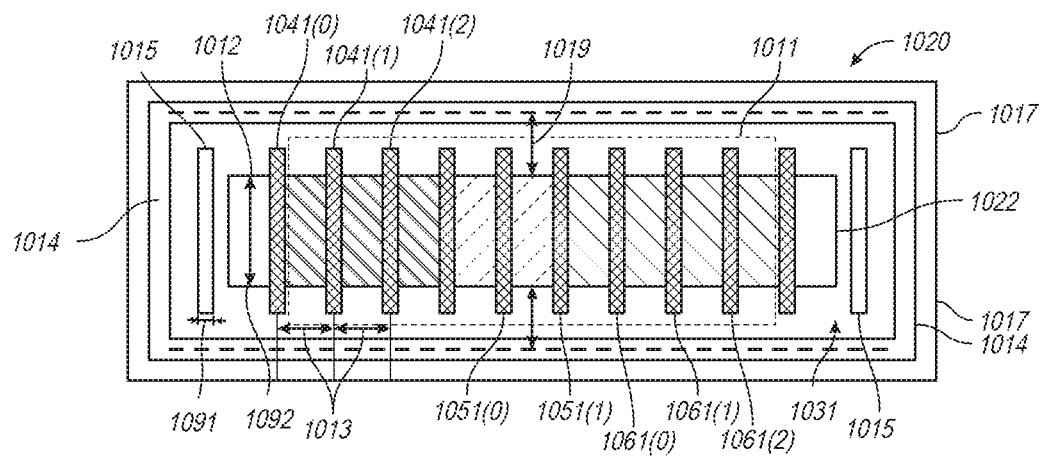
FIG. 10 illustrates a view of an undivided transistor group in accordance with an embodiment of the disclosure.

FIG. 10 illustrates a view 1020 of an undivided transistor group 1011 in accordance with an embodiment of the disclosure. The undivided transistor group 1011 is exemplary of one of the groups A, B, C, E, F, and G transistors 641-646 of FIG. 6 or the groups A, B, C, E, F, and G transistors 741-746 of FIG. 7. The undivided transistor group 1020 may be produced in a single well/substrate region 1031 surrounded by an element isolation region 1017 to isolate the well/substrate region 1031 from other well/substrate regions, in some examples. The group of transistors included in the undivided transistor group 1011 includes transistors 1041(0)-(2), 1051(0)-(1), and 1061(0)-(2). The undivided transistor group 1011 also includes dummy transistors 1012 and 1022 at each end of the undivided transistor group 1011. The transistors 1041(0)-(2), 1051(0)-(1), and 1061(0)-(2) and dummy transistors 1012 and 1022 may have the same pitch 1013 and the same distance 1019 to a well/substrate contact 1014 of the well/substrate region 1031. Each of the transistors 1041(0)-(2), 1051(0)-(1), and 1061(0)-(2) and dummy transistors 1012 and 1022 may have a same gate length 1091 and a same diffusion region width 1092. In contrast with the divided transistor group 911 of FIG. 9, the transistors 1041(0)-(2), 1051(0)-(1), and 1061(0)-(2) and dummy transistors 1012 and 1022 of the undivided transistor group 1011 are all immediately adjacent to one another (e.g., are not separated by individual dummy transistors) such that the respective diffusion regions may overlap with each other.

Figure 11:
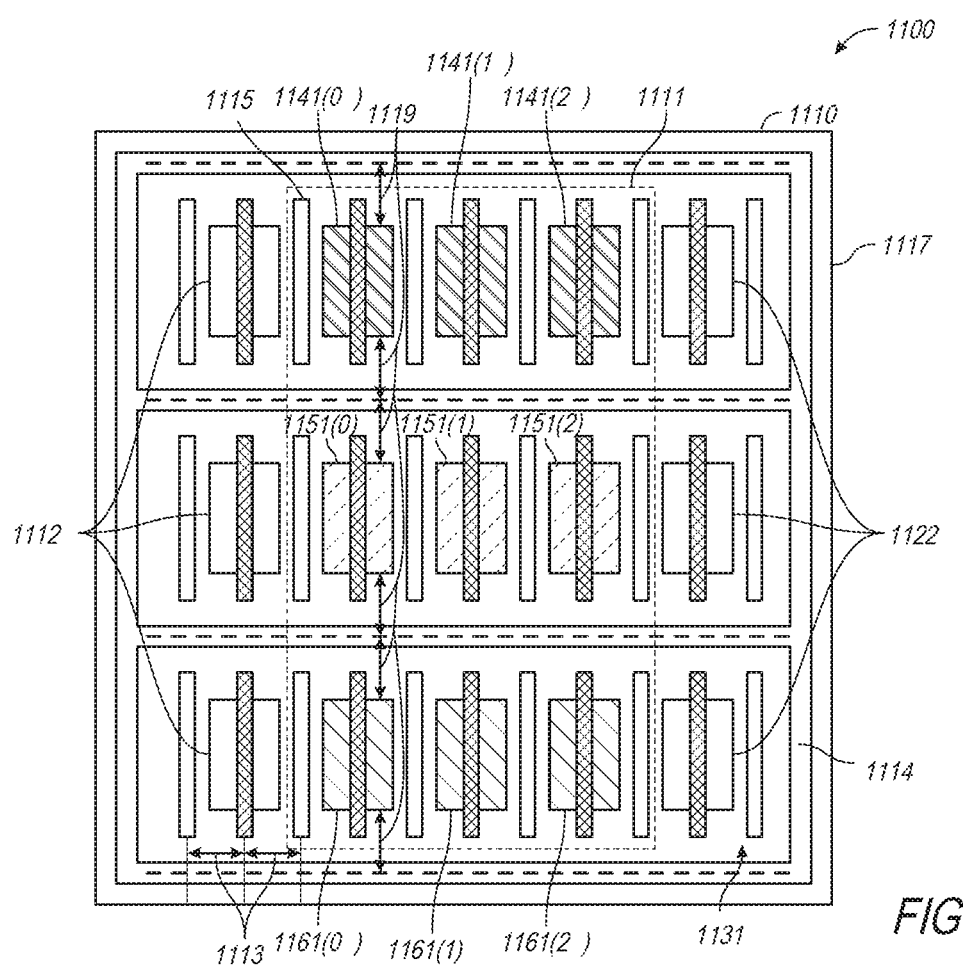
FIG. 11 illustrates a view of a longitudinal transistor group in accordance with an embodiment of the disclosure.

FIG. 11 illustrates a view 1100 of a longitudinal transistor group 1111 in accordance with an embodiment of the disclosure. The longitudinal transistor group 1111 is an exemplary one of the groups A, B, C, E, F, and G transistors 641-646 of FIG. 6 or the groups A, B, C, E, F, and G transistors 741-746 of FIG. 7. The longitudinal transistor group 1111 may be produced in a single well/substrate region 1131 surrounded by an element isolation region 1117 to isolate the well/substrate region 1131 from other well/substrate regions, in some examples. The longitudinal transistor group 1111 includes subgroups of transistors 1141(0)-(2), 1151(0)-(2), and 1161(0)-(2) each arranged in a separate row. The longitudinal transistor group 1111 may also include dummy transistors 1112 and 1122 at each end of the longitudinal transistor group 1111. The transistors 1141(0)-(2), 1151(0)-(2), and 1161(0)-(2) and dummy transistors 1112 and 1122 may have the same pitch 1113 and the same distance 1019 to a well/substrate contact 1114 of the well/substrate region. 1131. Individual dummy transistors 1115 with a deep well may be inserted between each of the transistors 1141(0)-(2), 1151(0)-(2), and 1161(0)-(2) such that the respective diffusion regions do not overlap with each other.

Figure 12:
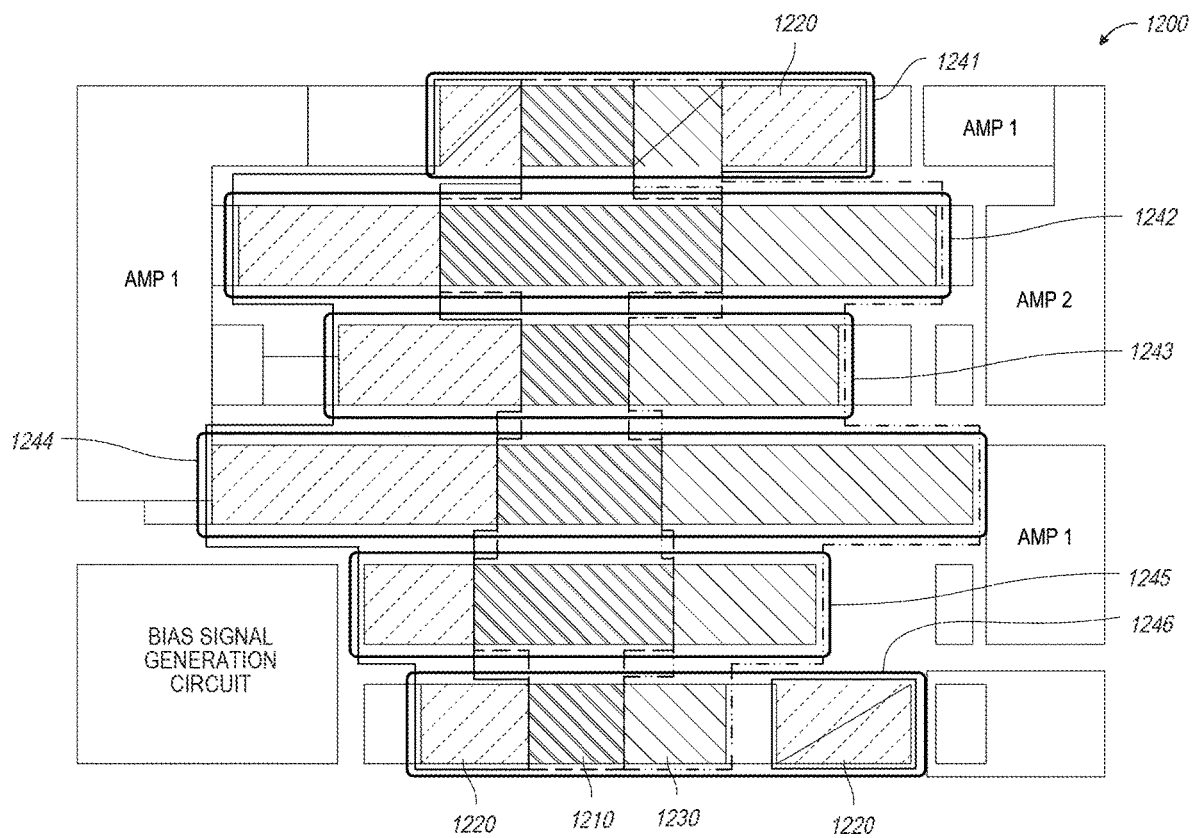
FIG. 12 illustrates a circuit diagram of a grouped reference voltage generator circuit in accordance with an embodiment of the disclosure.

FIG. 12 illustrates a circuit diagram of a grouped reference voltage generator circuit 1000 in accordance with an embodiment of the disclosure. The grouped reference voltage generator circuit 1200 may include a bias signal generation circuit 1210, an amplifier circuit 1020, and an amplifier circuit 1230. The bias signal generation circuit 1210 may implement at least a portion of the bias signal generation circuit 210 of FIG. 2, the bias signal generation circuit 300 of FIG. 3, the bias signal generation circuit 400 of FIG. 4, and/or the grouped reference voltage generator circuit 601 of FIG. 6. The amplifier circuit 1220 may implement at least a portion of the amplifier circuit 220(0) of FIG. 2, the amplifier circuit 500 of FIG. 5, and/or the grouped reference voltage generator circuit 601 of FIG. 6. The amplifier circuit 1230 may implement at least a portion of the amplifier circuit 220(1) of FIG. 2, the amplifier circuit 500 of FIG. 5, and/or a portion of the amplifier circuit 630 of FIG. 6. As shown in the grouped reference voltage generator circuit 1200, each of the group A transistors 1241, the group B transistors 1242, the group C transistors 1243, the group E transistors 1244, the group F transistors 1245, and the group G transistors 1246 may include transistors from each of the bias signal generation circuit 1210, the amplifier circuit 1220, and the amplifier circuit 1230. The transistors of each respective group A, B, C, E, F, and G transistors 1241-1246 may perform the same or similar functions (e.g., handle specific voltage magnitude differentials) and have the same or similar characteristics (e.g., same gate length and/or same diffusion region width), and therefore may be collectively arranged in a collection that is physically proximate to one another (e.g., in the same well/substrate region), such that the individual group may be fabricated at the same time using the same process. The proximity of the transistors to one another, as well as the contemporaneous fabrication may reduce deviations among the transistors within a group as compared with a physically disparate arrangement (e.g., as shown in the ungrouped reference voltage generator circuit 600) of the same transistors. Potential deviations may include differences in doping in an implanted material at a time of finish. Further, co-locating similar transistors in a group may reduce a size, as a number of dummy transistors used to separate different transistor types may be reduced.

It is appreciated that the number of transistors within the various groups of transistors described in this disclosure are exemplary, and that the number of transistors within each of the groups of transistors can be constricted or expanded to include any number of transistors (e.g., may vary based on the application and implementation) without departing from the scope of the disclosure. If will also be appreciated that more or less groups may be formed without departing from the scope of the disclosure.

From the foregoing it will be appreciated that, although specific embodiments of the disclosure have been described herein for purposes of illustration, various modifications may be made without deviating from the spirit and scope of the disclosure. Accordingly, the disclosure is not limited except as by the appended claims.

What is claimed is:

1. An apparatus comprising:
   a first reference voltage amplifier circuit configured to provide a first reference voltage, wherein the first reference voltage amplifier circuit comprises a first transistor and a second transistor, the first transistor comprising a first gate electrode having a first length and a first diffusion region having a first width, the second transistor comprising a second gate electrode having a second length and a second diffusion region having a second width, the first width different from the second width, the first length different from the second length;
   a second reference voltage amplifier circuit configured to provide a second reference voltage, wherein the second reference voltage amplifier circuit comprises a third transistor and a fourth transistor, the third transistor comprising a third gate electrode having the first length and a third diffusion region having the first width, the fourth transistor comprising a fourth gate electrode having the second length and a fourth diffusion region having the second width;
   wherein the first and third transistors are collectively arranged and the second and fourth transistors are collectively arranged.

2. The apparatus of claim 1, wherein the first transistor and the third transistor are formed adjacent to each other such that the first diffusion region and the third diffusion region overlap.

3. The apparatus of claim 1, wherein a dummy transistor is formed between the first transistor and the third transistor such that the first diffusion region is completely separate from the third diffusion region.

4. The apparatus of claim 1, further comprising a dummy transistor formed on each end of a transistor group that includes the first transistor and the third transistor.

5. The apparatus of claim 4, wherein the transistor group is formed in a single substrate well.

6. The apparatus of claim 1, wherein the first amplifier circuit is configured to receive first and second input signals and to provide a first output signal in response to the first and second input signals having the first reference voltage based on bias voltage signals from a bias signal generation circuit, and wherein the second amplifier circuit is configured to receive third and fourth input signals and to provide a second output signal in response to the third and fourth input signals having the second reference voltage based on the bias voltage signals.

7. The apparatus of claim 6, further comprising the bias signal generation circuit configured to provide the bias voltage signals to the first amplifier circuit and to the second amplifier circuit.

8. The apparatus of claim 6, wherein the bias signal generation circuit includes a fifth transistor arranged with the first and third transistors.

9. The apparatus of claim 8, wherein the fifth transistor has the first length.

10. The apparatus of claim 8, wherein the bias signal generation circuit includes a sixth transistor arranged with the second and fourth transistors.

11. An apparatus comprising:
    a first reference voltage amplifier circuit configured to provide a first reference voltage, wherein the first reference voltage amplifier circuit comprises a first transistor and a second transistor, the first transistor comprising a first gate electrode having a first length and a first diffusion region having a first width, the second transistor comprising a second gate electrode having a second length and a second diffusion region having a second width, the first width different from the second width, the first length different from the second length;
    a second amplifier circuit configured to provide a second reference voltage, wherein the second reference voltage amplifier circuit comprises a third transistor and a fourth transistor, the third transistor comprising a third gate electrode having the first length and a third diffusion region having the first width, the fourth transistor comprising a fourth gate electrode having a fourth length and a fourth diffusion region having the second width;
    a first well region formed on a semiconductor substrate and surrounded by an element isolation region; and
    a second well region formed on the semiconductor substrate and surrounded by the element isolation region,
    wherein the first and third transistors are formed in the first well region,
    wherein the second and fourth transistors are formed in the second well region.

12. The apparatus of claim 11, wherein, within the first well region, the first transistor and the third transistor are formed adjacent to each other such that the first diffusion region and the third diffusion region overlap.

13. The apparatus of claim 11, further comprising a dummy transistor formed within the first well region between the first transistor and the third transistor.

14. The apparatus of claim 11, further comprising a dummy transistor formed on each end of a transistor group that includes the first transistor and the third transistor.

15. The apparatus of claim 11, further comprising a sixth transistor formed between the first and third transistors.

16. The apparatus of claim 15, wherein the sixth transistor is part of a bias signal generation circuit configured to control the first and second voltage reference signals output from the first and second amplifiers.

17. The apparatus of claim 15, wherein the sixth transistor comprises a sixth gate electrode having the first length.

18. The apparatus of claim 17, wherein the sixth transistor further comprises a sixth diffusion region having the first width.

19. The apparatus of claim 11, wherein the first amplifier circuit is configured to receive first and second input signals and to provide the first reference voltage in response to the first and second input signals.

20. The apparatus of claim 19, wherein the second amplifier circuit is configured to receive third and fourth input signals and to provide the second reference voltage in response to the third and fourth input signals.

* * * * *